United States Patent
Vervaeke et al.

(10) Patent No.: US 10,310,029 B2
(45) Date of Patent: Jun. 4, 2019

(54) METHOD AND DEVICE FOR MEASURING A MAGNETIC FIELD DISTRIBUTION OF A MAGNET ALONG A MAIN SURFACE OF SAID MAGNET

(71) Applicant: MagCam NV, Leuven (BE)

(72) Inventors: Koen Vervaeke, Linden (BE); Stephan Kliché, Hemiksem (BE)

(73) Assignee: MAGCAM NV, Leuven (BE)

( * ) Notice: Subject to any disclaimer, the term of this patent is extended or adjusted under 35 U.S.C. 154(b) by 0 days.

(21) Appl. No.: 15/037,017

(22) PCT Filed: Mar. 31, 2015

(86) PCT No.: PCT/EP2015/057039
§ 371 (c)(1),
(2) Date: May 16, 2016

(87) PCT Pub. No.: WO2015/155068
PCT Pub. Date: Oct. 15, 2015

(65) Prior Publication Data
US 2017/0038441 A1    Feb. 9, 2017

(30) Foreign Application Priority Data
Apr. 11, 2014    (EP) .................................... 14164467

(51) Int. Cl.
*G01R 33/10*    (2006.01)
*G01R 33/00*    (2006.01)

(52) U.S. Cl.
CPC ......... *G01R 33/10* (2013.01); *G01R 33/0094* (2013.01)

(58) Field of Classification Search
CPC .............. G01R 33/0094; G01R 33/032; G01R 33/0322; G01R 33/0325; G01R 33/10;
(Continued)

(56) References Cited

U.S. PATENT DOCUMENTS 3,670,239 A * 6/1972 Shiraiwa ................. G01N 27/82
257/E29.323
4,218,651 A * 8/1980 Ivy ......................... E21B 17/006
324/151 R
(Continued)

OTHER PUBLICATIONS

Hwang, J., et al., "The application of differential-type Hall sensors array to the nondestructive testing of express train wheels," NDT&E International, 2009, vol. 42, pp. 34-41.
(Continued)

*Primary Examiner* — Jeff W Natalini
*Assistant Examiner* — Steven L Yeninas
(74) *Attorney, Agent, or Firm* — Duane Morris LLP; J. Rodman Steele, Jr.; Gregory M. Lefkowitz

(57) ABSTRACT

A method for determining a magnetic field of a magnet along a surface of the magnet, the method comprising:
  performing a relative movement between the surface of the magnet and a magnetic camera device;
  measuring the magnetic field by means of the magnetic camera device, to thereby obtain magnetic field measurements for the surface;
wherein the relative movement is a continuous movement which is a combination of a relative translational movement and a relative rotational movement; and apparatus.

16 Claims, 6 Drawing Sheets

(58) Field of Classification Search
CPC .... G01R 33/12; G01R 33/1215; G01N 27/82; G01N 27/72; G01N 27/902; G01N 27/83; G01N 27/85; G01N 27/87; G01N 27/9006; G01N 27/9013; G01N 27/904; G01N 27/9026; G01N 2291/2632; G01N 2291/2634; G01N 2291/2636
USPC ............ 73/79; 324/205, 238, 240, 242, 243, 324/244.1, 209, 222, 261, 262, 210, 211, 324/212, 213; 382/320
See application file for complete search history.

(56) References Cited

U.S. PATENT DOCUMENTS

| | | | | |
|---|---|---|---|---|
| 5,130,652 | A * | 7/1992 | Kawakami | G01N 27/902 324/238 |
| 5,135,303 | A * | 8/1992 | Uto | G01N 21/88 250/559.05 |
| 5,254,946 | A * | 10/1993 | Guzik | G01R 33/1207 324/212 |
| 6,037,767 | A * | 3/2000 | Crescenzo | G01N 27/82 324/220 |
| 6,366,085 | B1 * | 4/2002 | Yeshurun | G01N 27/83 324/235 |
| 6,781,688 | B2 * | 8/2004 | Kren | G01N 21/9501 356/237.1 |
| 8,593,157 | B2 * | 11/2013 | Adams | G01S 13/89 324/244.1 |
| 2004/0004475 | A1 | 1/2004 | Goldfine et al. | |
| 2006/0103382 | A1 * | 5/2006 | Mihara | G11B 5/4555 324/262 |
| 2007/0046287 | A1 | 3/2007 | Vervaeke et al. | |
| 2009/0128135 | A1 * | 5/2009 | Masham | G01R 33/06 324/205 |
| 2012/0209546 | A1 | 8/2012 | Vervaeke et al. | |
| 2013/0214771 | A1 * | 8/2013 | Tiernan | G01N 27/904 324/242 |
| 2016/0018484 | A1 * | 1/2016 | Kimura | G01R 33/10 702/57 |

OTHER PUBLICATIONS

Hwang, J., et al., "Modeling of a Scan Type Magnetic Camera Image Using the Improved Dipole Model," J. of Mech. Sci. & Tech., 2006, vol. 20, No. 10, pp. 1691-1701.

Benitez, D.S., et al., "A 1-D Solid-State-Sensor-Based Array System for Magnetic Field Imaging of Steel Reinforcing Bars Embedded Within Reinforced Concrete," IEEE Transactions on Instrumentation and Measurement, Jul. 2009, vol. 58, No. 9, pp. 3335-3340.

Cajal, D., et al., "A study of the various phases of the break in a low-voltage circuit breaker thanks to the magnetic camera," Journal of Physics D: Applied Physics, May 1999, vol. 32, No. 10, pp. 1130-1135.

* cited by examiner

METHOD AND DEVICE FOR MEASURING A MAGNETIC FIELD DISTRIBUTION OF A MAGNET ALONG A MAIN SURFACE OF SAID MAGNET

CROSS-REFERENCE TO RELATED APPLICATIONS

This application is a § 371 national stage entry of International Application No. PCT/EP2015/057039, filed Mar. 31, 2015, which claims priority to European Patent Application No. 14164467.4 filed Apr. 11, 2014, the entire contents of which are incorporated herein by reference.

TECHNICAL FIELD

The present disclosure relates to devices and methods for determining a magnetic field of a magnet.

BACKGROUND ART

Fast and accurate quality inspection of permanent magnets is increasingly important in development and production of many technological products, such as position sensors, electric motors and actuators, speakers and microphones, medical devices, automotive electronics etc. The quality of the end product is often directly influenced and largely dependent on the quality of permanent magnets in these products. Moreover, price volatility of rare earth materials, which are critical for making permanent magnets, force developers and manufacturers to use these precious materials in an efficient way, minimizing the amount of wasted magnet material, in other words, get the most performance out of the least amount of magnet material, meaning each magnet needs to conform to strict quality demands. Also from an economic point of view, quality control of permanent magnets is growing in importance.

A magnetic measurement system is known, also referred to as a magnetic field camera, which is an advanced magnet inspection technology for all kinds of permanent magnets, including uniaxial and multi pole magnets in various applications. The magnetic field camera technology is based on mapping the magnetic field distribution of a magnet using a plurality of magnetic field sensors.

In European patent application EP1720026, an example of such a magnetic field camera, also called a magnetic camera module, is described.

In European patent application EP2508906, an arrangement is described for characterizing magnetic systems based on an initialized set of input parameters of the magnetic system, the arrangement comprising:
means for measuring the magnetic field distribution, typically embodied as a magnetic camera module, and
means for determining an optimal expected magnetic field distribution of the magnetic system.

There exist a need in industry for magnetic field camera's which are capable of determining magnetic field distributions over areas, for instance a surface area of a magnet, which are larger than the intrinsic measurement or sensing area of the magnetic field camera.

SUMMARY OF THE DISCLOSURE

It is an aim of the present disclosure to provide a method for determining a magnetic field distribution of a magnet along a surface of the magnet. This aim is achieved according to the disclosure with a method comprising the steps of the first independent claim.

It is another aim of the present disclosure to provide a device or apparatus for determining a magnetic field distribution of a magnet along a surface of the magnet.

This aim is achieved according to the disclosure with the device showing the technical characteristics of the second independent claim.

In a first aspect of the present invention, a method for determining a magnetic field of a magnet along a surface of the magnet is disclosed, the method comprising:
performing a relative movement between the surface of the magnet and a magnetic camera device;
measuring the magnetic field by means of the magnetic camera device, to thereby obtain magnetic field measurements for the surface;
wherein the relative movement is a continuous movement which is a combination of a relative translational movement and a relative rotational movement.

Once magnetic field measurements are performed for the surface, the corresponding data comprising measurement values can be used to model and analyze the magnetic field of the magnet, for instance by means of an appropriate software or computer program. Preferably, the method according to aspects of the present invention comprises determining position coordinates for respective magnetic field measurement values, based at least on parameters defining the relative movement. The method according to aspects of the present invention may further also comprise interpolating measurement values determined for their calculated positions, in order to derive virtual measurement values according to positions corresponding to a regular grid pattern.

Hereby the magnetic field of the magnet can be scanned along a surface thereof, for instance along a main surface thereof. According to preferred embodiments, the scanning can be a continuous process; i.e. the measurements and relative movements are occurring contemporaneously, whereby the relative movement is not stopped (does not have a speed equal to zero) when a magnetic field measurement is performed.

The relative movement is a continuous, uninterrupted movement. Preferably, the pattern defined by the relative movement is continuous in the mathematical sense. Preferably, the relative movement does not comprise an interruption, and the relative speed of the movement is always larger than zero. Preferably, both the relative translational movement and the relative rotational movement always have a speed which is different from zero, i.e. have a non-zero speed. The pattern defined by the relative movement is preferably a smooth curve, i.e. it can be described as a smooth function in the mathematical sense.

It is an advantage of embodiments of the present invention that a magnetic field distribution of a magnet, for instance of a complete main surface thereof, can be determined in a quick and/or automated way.

It is a further advantage of embodiments of the present invention that the magnetic field distribution can efficiently be determined for a main surface of a magnet which is larger or substantially larger than the detection surface of a single magnetic camera.

A magnetic field camera device can be a device which comprises a plurality of sensors, for instance arranged in a matrix or line configuration, each sensor capable of measuring properties of a magnetic field, and which is capable of measuring a magnetic field distribution. A magnetic field camera can for instance be a camera as disclosed in EP1720026 or EP2508906, which are hereby incorporated by reference. It can for instance be a 2-dimensional (2D) or 1-dimensional (1D) Hall sensor array or a 2D or 1D array of another type of magnetic field sensors.

Measuring the magnetic field may comprise measuring a single component of the magnetic field, as the skilled person will recognize. It may for instance comprise measuring the (magnitude of the) out of plane component of the magnetic field which respect to a main surface of a magnet. It may also be a component of the magnetic field of the magnet along another direction. A magnetic field component may for instance comprise the magnitude of the projection of the magnetic field vector on an axis or on a surface, or the magnitude of the magnetic field vector itself.

According to preferred embodiments, the magnetic camera device comprises a one-dimensional array of at least two magnetic field sensors. According to preferred embodiments, where the magnetic field camera is a 2D-sensor array, it is sufficient and preferred to only use a single row/column of said magnetic field camera device in embodiments of the present disclosure.

According to preferred embodiments, the one-dimensional array of at least two magnetic field sensors is arranged along a first direction. For instance the at least two magnetic field sensors may have sensitive areas which are aligned and are arranged in a single plane.

This provides the advantage that a relative simple readout and/or magnetic image reconstruction algorithm can be used eventually.

According to preferred embodiments, the relative translational movement is a movement parallel to, for instance along, the first direction.

According to preferred embodiments, the relative rotational movement is a movement wherein the surface of the magnet rotates around an axis, the axis defining a second direction.

According to preferred embodiments, the first direction and the second direction are parallel, resulting in a helical relative movement. These embodiments are particularly useful for measuring magnetic field distributions of magnets with cylindrical shape.

According to preferred embodiments, the first direction and the second direction are perpendicular, resulting in a spiraling relative movement. These embodiments are particularly useful for measuring magnetic field distributions of magnets having a ring or disk shape.

The use of a helical or spiraling relative movement provides a smooth scanning process and provides the measurement data corresponding to the measurement of the magnetic field by the magnetic field sensor device in a suitable format to easily, i.e. with simple calculations, map the measurements to position coordinates with respect to the surface of the magnet.

According to preferred embodiments, the spiraling or helical relative movement results in a full scan of the magnetic field or field component along the surface of the magnet.

According to preferred embodiments, the spiraling or helical relative movement results in a full scan of the magnetic field or field component along the surface of the magnet, and extends beyond the boundaries of the surface of the magnet, for instance at a distance from the magnet. This provides the advantage that the spatial extension of the magnetic field generated by the magnet can be measured and thus analyzed.

According to preferred embodiments, performing a full scan comprises scanning a portion of the surface more than once, for instance at subsequent rotation cycles of the relative rotational movement. This portion can be seen as an overlap portion. The presence of an overlap portion, and thus a double magnetic field imaging of this portion during the magnetic field measurement process, may allow performing a more precise mapping of measurement values to positions where the respective measurements were taken.

According to preferred embodiments, measuring the magnetic field by means of the magnetic camera device is performed at predetermined instances in time. Alternatively, these time instances are registered, and associated with their measurement values.

The predetermined instances in time are preferably separated by constant time intervals, in order to obtain a homogeneous measurement point density.

According to preferred embodiments, the speed of the relative translational movement and the (angular) speed of the relative rotational movement are predetermined, and preferably always different from zero. This may simplify a mapping process of measured magnetic field values to positions.

According to preferred embodiments, the speed of the relative translational movement and the (angular) speed of the relative rotational movement are constant, preferably different from zero.

According to a second aspect of the present invention, an apparatus for determining a magnetic field of a magnet along a surface of the magnet is disclosed, the apparatus comprising:

a means for performing a relative movement between the surface of the magnet and a magnetic camera device;

a magnetic camera device for thereby obtain magnetic field measurements for the surface;

wherein the means for performing a relative movement is adapted for performing a relative movement which is a continuous movement which is a combination of a relative translational movement and a relative rotational movement.

According to preferred embodiments, the magnetic camera device comprises a one-dimensional array of at least two magnetic field sensors.

According to preferred embodiments, the one-dimensional array of at least two magnetic field sensors is arranged along a first direction.

According to preferred embodiments, the means for performing a relative movement is adapted for performing a relative translational movement parallel to (or along) the first direction.

According to preferred embodiments, the means for performing a relative movement is adapted for rotating the (surface of the) magnet around an axis, the axis defining a second direction.

According to preferred embodiments, the first direction and the second direction are parallel, resulting in the performance of a helical relative movement.

According to preferred embodiments, first direction and the second direction are perpendicular, resulting in a spiraling relative movement.

According to preferred embodiments, the means for performing a relative movement is adapted for performing a spiraling or helical relative movement which results in a full scan of the magnetic field along the surface.

According to preferred embodiments, the means for performing a relative movement is adapted for performing a spiraling or helical relative movement which results in a full scan of the magnetic field along the surface, thereby scanning a portion of the surface more than once, at subsequent rotation cycles of the relative rotational movement.

According to preferred embodiments, the magnetic camera device is adapted for performed measurements at predetermined instances in time. These instances can be separated by constant time intervals.

According to preferred embodiments, the instances in time at which magnetic field measurements are performed by different magnetic field sensors of the magnetic camera device are different. According to preferred embodiments, magnetic field measurements are performed by adjacent magnetic field sensors at subsequent instances in time.

According to preferred embodiments, wherein a speed of the relative translational movement and an angular speed of the relative rotational movement are predetermined.

According to preferred embodiments, a speed of the relative translational movement and an angular speed of the relative rotational movement are constant.

According to preferred embodiments, the means for providing the relative movement may further comprise a controller for steering or controlling the movement.

According to preferred embodiments, the rotation means or apparatus comprises a rotor of an electromagnetic engine.

In a preferred embodiment, the magnetic field sensor device comprises an array of at least 10 magnetic field sensors. In a more preferred embodiment, the magnetic field sensor device comprises an array of at least 100 magnetic field sensors.

In a preferred embodiment, the relative distance between consecutive sensors in the sensor array is less than 1 mm. In a more preferred embodiment, the relative distance between consecutive sensors in the sensor array is less than 0.2 mm.

In a preferred embodiment, the time for reading a single sensor is less than 1 ms.

Features and advantages disclosed for one of the above aspects of the present invention are hereby also implicitly disclosed for the other aspects, mutatis mutandis, as the skilled person will recognize. For instance, the device may comprise any means necessary which are adapted to perform any of the embodiments described for the method aspect of the present invention.

According to preferred embodiments, all or part of the above is applied for the inspection of permanent magnets or magnet assemblies in industrial or academic applications, such as for sensor systems, switches and relays, electric motors, actuators, speakers, microphones, magnetic couplings, holding magnets, beam guiding systems, wigglers, undulators, permanent magnet bearings, measuring instruments, research equipment, new magnetic materials, non-destructive testing of magnetic materials such as steel.

Examples of industries where aspects of the present invention can be used are: automotive, industrial, medical, consumer electronics, magnet production, research laboratories.

BRIEF DESCRIPTION OF THE DRAWINGS

The disclosure will be further elucidated by means of the following description and the appended figures.

DETAILED DESCRIPTION OF PREFERRED EMBODIMENTS

Figure 1:
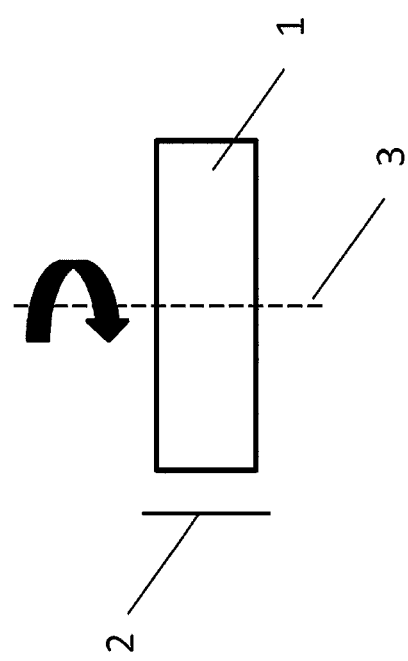
FIG. 1 shows an architecture aiding understanding aspects of the present invention.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

In EP12188521.4, filed on Oct. 15, 2012, devices and methods are described for determining a magnetic field distribution of a magnet along a main surface of the magnet, the device comprising:

an arrangement of at least two independent magnetic field camera modules being arranged in a fixed relative position with respect to each other, each magnetic field camera module being adapted for measuring a magnetic field distribution to which it is exposed by means of a respective detection surface;

a means for providing a predetermined relative movement between the main surface and the arrangement to thereby scan the magnetic field distribution of the magnet along the main surface.

The above patent application finds applications where magnetic field distributions need to be determined over relatively large areas, namely when the main surface of a magnet is larger than the intrinsic measurement area of the magnetic field camera.

In practice however, it is often preferred to use one single magnetic field camera to measure the relatively large areas, thereby using relative mechanical movement of the magnetic field camera with respect to the magnet.

Methods for determining a magnetic field of a magnet 1 along a surface of the magnet are now described, the methods comprising:

performing a relative movement between the surface of the magnet 1 and a magnetic camera device 2;

measuring the magnetic field by means of the magnetic camera device 2, to thereby obtain magnetic field measurements for the surface;

wherein the relative movement is a continuous movement which is a combination of a relative translational movement and a relative rotational movement.

According to a first preferred embodiment, illustrated in FIG. 1, a method is disclosed for measuring a magnetic field along the full cylindrical surface of a cylinder-shaped magnetic system 1. Such a system may comprise for instance a cylindrical or ring-shaped permanent magnet, an assembly of multiple magnets arranged on a cylindrical surface, a permanent magnet rotor for use in an electric motor etc. The magnetic field values, forming a magnetic field distribution, are determined using an array of magnetic field sensors or a magnetic field camera 2, such as an array of Hall sensors, magnetoresistive sensors or another type of magnetic field sensors known to the skilled person. The array can also be one row of sensors within a matrix of magnetic field sensors. The sensor array is preferably oriented along a first direction such that the direction of the array is parallel to the axial direction of the cylinder-shaped magnetic system and the orientation of the sensitive surface of the sensors is such that the desired magnetic field component is measured, for instance the radial component, being the component perpendicular to the axial direction of the cylinder-shaped magnetic system. The cylinder-shaped magnetic system can be rotated around a first rotation axis 3, its longitudinal axis, corresponding to a second direction, thereby performing a rotational movement. The first direction and second direction are hereby parallel. The magnetic field sensor device 2 can be located above the magnet's surface at a fixed height. The relative rotational movement can for instance be embodied by rotating the magnet and keeping the magnetic sensor device 2 at a fixed position above the surface of the magnet 2. Alternatively, the relative rotational movement may embody keeping the magnet 1 in a fixed position, and rotating the magnetic field sensor device around the magnet at a, for instance fixed, height above the surface of the magnet 2.

In a basic example, the length Ls of the sensor array is equal or larger than the length Lm of the cylindrical magnet in the axial direction ("z"-direction). If the sensor array is positioned at a certain fixed position along the axial direction, such that both ends of the sensor array coincide with or extend beyond the boundaries of the cylindrical magnet in the axial direction, the magnetic field distribution along the main cylinder surface of the cylindrical magnet can be determined in the following way.

The measurement values from the sensor array are recorded with regular time intervals, which can be relatively fast. Thereby all sensors in the array may record the local magnetic field simultaneously, or they may do so sequentially, but with regular time intervals between them. Let N be the number of sensors in the array. Then the distance between two sensors is $\Delta x = L_s/(N-1)$. The notation t_a (expressed in 'seconds') is used for the time period between two measurements of the sensor array. In practice, only part of the sensor array may be used for recording the magnetic field, for instance in order to increase the measurement speed or to reduce the spatial resolution.

Simultaneously to recording the magnetic field values from the sensor array at regular time intervals, the cylindrical magnet is rotated around its axis, relative to the sensor array, at a predetermined constant speed v_rot (expressed for instance in 'degrees per second' or '°/s'), such that after a period t_a, the cylinder has rotated over an angle equal to $\Delta\theta = v_{rot} \cdot t_a$. Thereby v_rot and t_a are chosen such that $\Delta\theta$ corresponds to the desired angular resolution of the determined magnetic field distribution. After the cylinder has performed a complete rotation over 360°, the full magnetic field distribution along the main cylindrical surface of the cylinder magnet has been determined.

Figure 2:
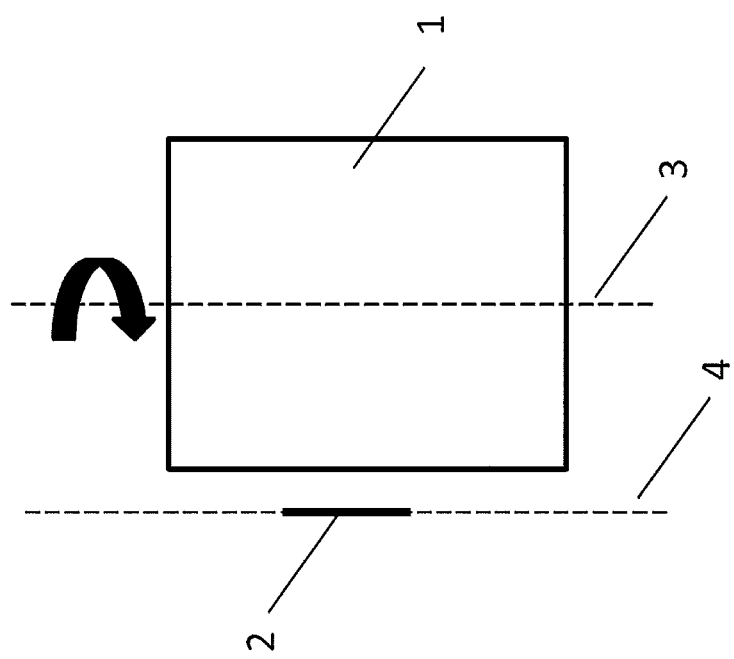
FIGS. 2, 3 and 4 illustrate embodiments of the present invention of the "helical relative movement" type.
Figure 3:
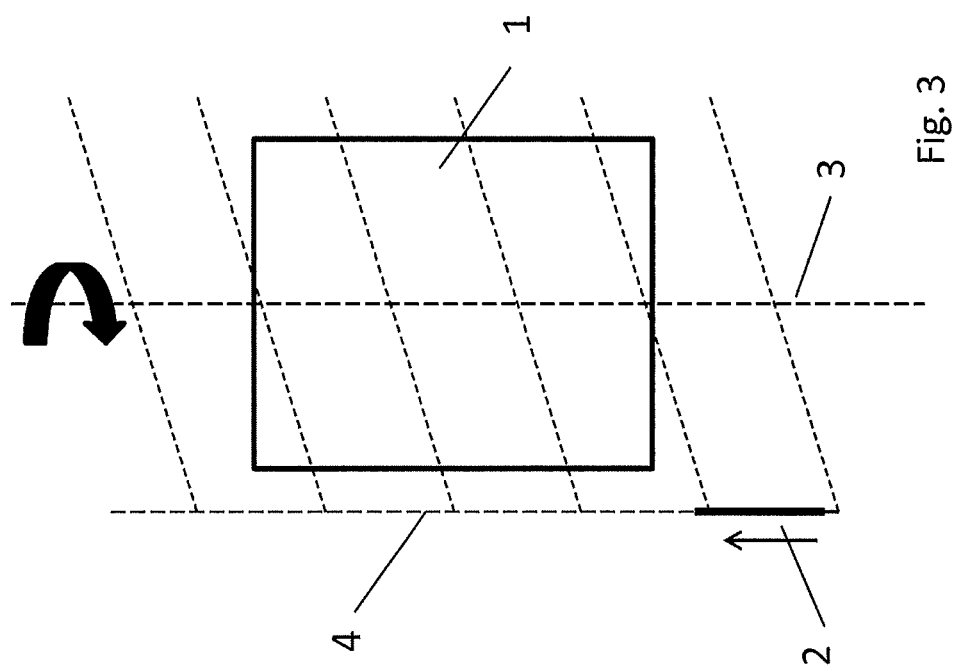

In a similar preferred embodiment, illustrated in FIG. 2, the length Ls of the sensor array is smaller than the length Lm of the cylindrical magnet in the axial direction. If the sensor array is arranged along a first direction and positioned at a certain fixed position along the axial direction, parallel to the axial direction which corresponds to the second direction, and the same procedure described above is executed, the magnetic field distribution of only a portion of the main cylindrical surface is determined, namely of a cylinder with axial length Ls. In order to determine the magnetic field distribution along a longer axial length of the main cylinder surface, the following method can be applied, as illustrated in FIG. 3. First the sensor array (arranged along a first direction) is placed parallel with the axial direction such that it is completely beyond the cylinder boundary. Then a relative rotational movement (comprising a rotation around an axis 3, axis 3 defining a second direction) of the cylinder magnet 1 with respect to the sensor array 2, arranged along a first direction 4, is performed, while simultaneously performing a relative translational movement in the axial direction (corresponding to first direction 4) of the sensor array with respect to the cylinder magnet. The translational movement, which is noted as v_ax, is chosen such that the sensor array describes a helical track or curve around the full cylinder surface, whereby the full cylinder surface is covered, such that the magnetic field distribution on the full cylinder surface can be determined. Thereby the values of v_ax and v_rot can be chosen such, that after one full rotation of 360°, the sensor array has shifted in the axial direction over a distance equal to its length Ls:

$$v_{ax} \cdot \frac{360°}{v_{rot}} = L_S.$$

Figure 4:
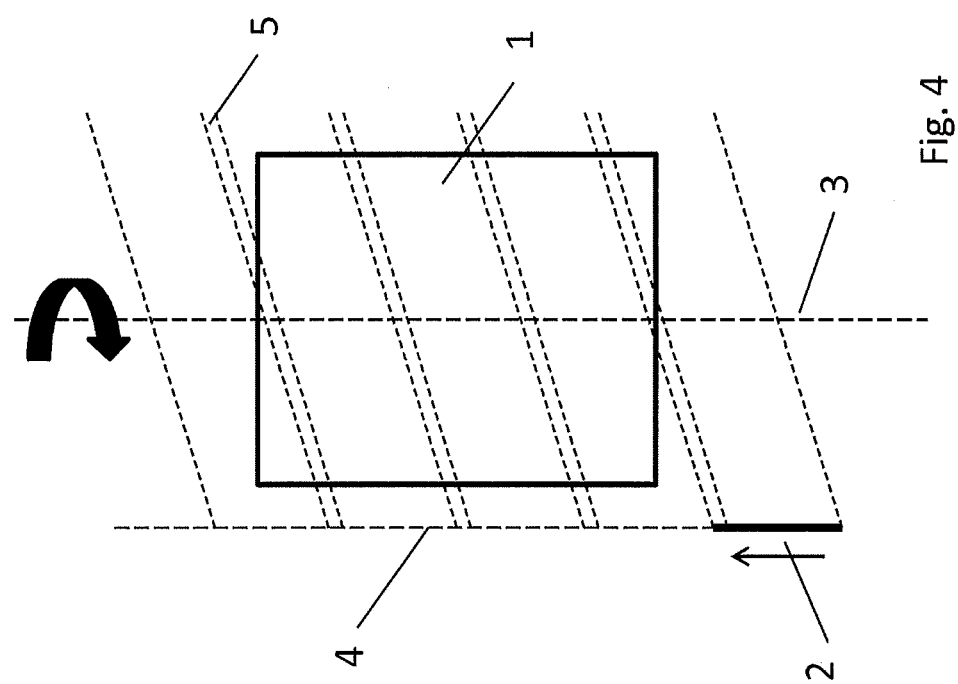

With this condition, the full cylinder surface is covered by the helical trajectory of the sensor array. If the value of v_ax is chosen to be smaller than this value, overlap 5 is created between the sensor array positions at subsequent 360° rotations, which in practice is useful for avoiding small gaps in the determined magnetic field distribution. This is illustrated in FIG. 4.

The relative rotational and translational movements or motions are continued until the sensor array has covered the full area of the surface of the cylinder magnet. In practice, some extended region in the axial direction at both sides of the magnet may be included.

An advantage of the described method is that during the measurement procedure, no synchronization is needed between the rotational motion, the translational motion and the sensor array readout, given that all mechanical speeds are constant and the readout of the sensors follows a regular timing pattern.

Another advantage of the described method is that it allows a fast measurement of the full magnetic field distribution along a main cylindrical surface of a magnet.

The resulting magnetic field distribution data of the above procedure should subsequently be mapped onto the correct cylindrical coordinates on the cylinder surface. Each position on the cylinder surface is described by the cylindrical coordinate ($\theta$, z), where $\theta$ is the angular coordinate and z is the axial coordinate. Each data point in the recorded magnetic field distribution data is located at a coordinate (i, j), where i is the index number of the recorded lines and j is the sensor index number in the sensor array (j=0, ..., N-1) with N the number of sensors in the array. The mapping of the (i,j) coordinates onto the (θ,z) can then be performed using following expressions:

$$\theta = \mathrm{mod}_{360°}(i \cdot t_a \cdot v_{rot} + (N-1-j) \cdot t_s \cdot v_{rot}) \quad z = i \cdot t_a \cdot v_{ax} + (N-1) \cdot \Delta x - (N-1-j) \cdot \mathrm{scandir} \cdot \Delta x \cdot t_s \cdot v_{ac}$$ Equation 1

Where scandir is the sign of the (electronic) scan direction of consecutive sensor readings inside the sensor array, which is +1 when the array is scanned in sense of the z-axis and −1 when scanned in the opposite sense.

Equation 1 assumes that the sensors in the sensor array are recorded in a sequential way, whereby the period between two consecutive sensor readouts in the array is t_s. In cases where all sensors are recorded in parallel, the parameter t_s can be set to zero in Equation 1, which simplifies the expression.

The person skilled in the art will be able to verify the correctness of Equation 1. The origin coordinate of Equation 1, i.e. the (θ=0, z=0) coordinate corresponds to the position of the first sensor being measured in the sensor array at that moment (in the case of sequential sensor reading) or to the position of the first sensor in the array (i.e. at the smallest z-position) at the moment of the first line recording (in the case of parallel sensor reading).

It is possible to determine the absolute position of the recorded magnetic field distribution with respect to the cylindrical magnet by determining the position of the magnet at the start of the recording procedure.

The application of Equation 1 results in a magnetic field distribution map with correct relative spacing in the θ and z directions between the measurement points, apart from an offset in the θ and z directions, which can be eliminated by determining the absolute position of the magnet at the start of the measurement (or at any other determined time). The coordinate or position grid resulting from Equation 1 is in general not a regular grid. A regular grid can be obtained by interpolating the data points onto a predetermined regular grid.

Figure 5:
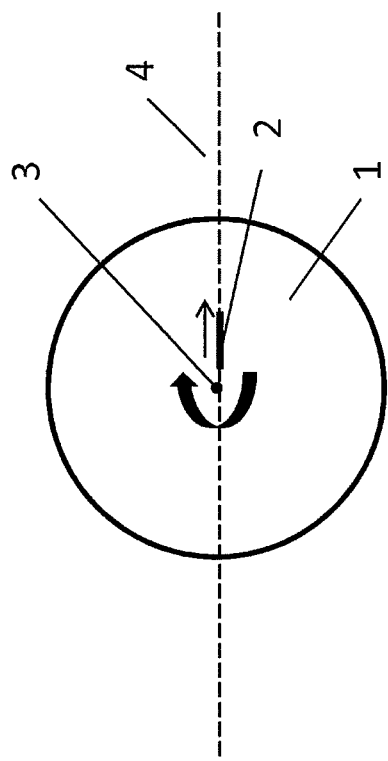
FIGS. 5 and 6 illustrate embodiments of the present invention of the "spiraling relative movement" type.
Figure 6:
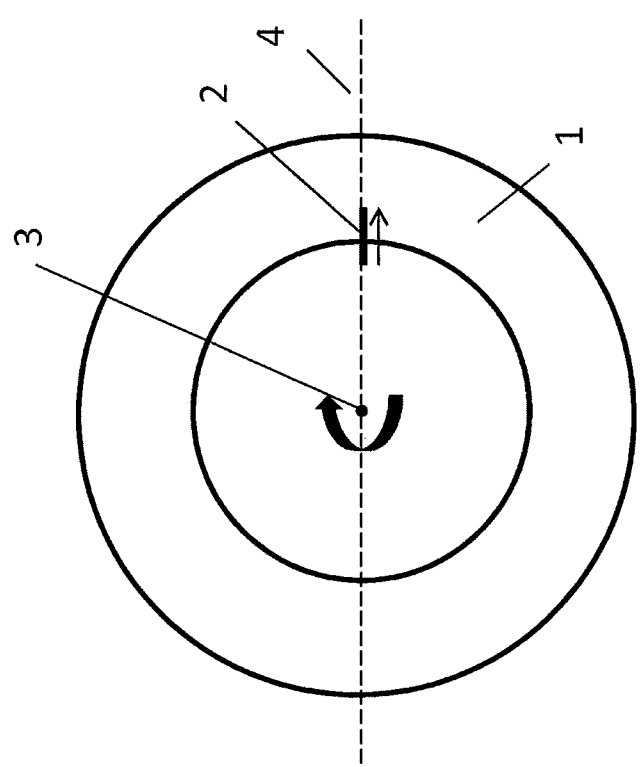

According to a second embodiment of the present invention, illustrated in FIG. 5 and FIG. 6, a similar method can be used when the magnetic field distribution along the disk surface of a magnet having a flat cylinder 1 or flat ring 1 shape needs to be determined. In that case, the 1D sensor array 2 is arranged above the upper surface (being the main surface of the flat cylinder or ring shape), preferably at a fixed distance there from. The sensor array 2 is oriented along the radial direction (first direction 4) of the ring or cylinder. The scanning of the magnet's main surface occurs while performing a relative translational movement along the radial direction 4, in combination with a relative rotational movement around an axis defining a second direction 3, for instance embodied as a rotation of the flat cylinder or ring around its longitudinal axis. The first direction 4 and the third direction are hereby perpendicular. The resulting relative movement is a spiraling relative movement. The spiraling relative movement preferably occurs in a plane parallel to the main surface of the magnet.

The skilled person will appreciate that a relative rotational movement can for instance be embodied by rotating the magnet around its longitudinal symmetry axis and keeping the magnetic sensor device 2 at a fixed height above the main surface of the magnet 2, while performing the translational movement with the magnetic field sensor device. Alternatively, the relative rotational movement may be embodied as keeping the magnet 1 in a fixed position, and performing the spiraling movement with the magnetic field sensor device 2 above the main surface of the magnet in a plane parallel to the main surface. Hereby, the magnetic field sensor device performs a rotational movement around an axis corresponding to the longitudinal symmetry axis of the magnet, and at the same time a translational movement along a radial direction of the magnet.

The person skilled in the art will be able to derive similar mathematical expressions as for the first embodiment of the present disclosure, in order to map associated positions or coordinates for the respective magnetic field measurements.

It will be appreciated that in all of the above embodiments of the present invention, measurement surfaces of the magnetic field sensors of the one-dimensional array are preferably arranged parallel, more preferably in a same plane. The measurement surfaces may for instance be arranged parallel to the plane defined by the surface which is scanned (along which magnetic field measurements are made), but may also be oriented under an angle different from zero or 180° degrees with respect to this plane. By introducing such an inclination between the measurement surfaces of the magnetic field sensors with respect to the surface to be scanned, a different magnetic field component can be measured.

The invention claimed is:

1. A method for determining a magnetic field of a magnet along a disk surface of said magnet, the method comprising:
    performing a relative movement between said disk surface of said magnet and a magnetic camera device comprising a one-dimensional array of at least two magnetic field sensors arranged along a first direction; and
    measuring said magnetic field by means of said magnetic camera device, to thereby obtain magnetic field measurements for said disk surface of said magnet,
    wherein said relative movement is a continuous movement which is a combination of a relative translational movement parallel to said first direction and a relative rotational movement,
    wherein said relative translational movement is a movement along a radial direction of said disk surface of said magnet,
    wherein said relative rotational movement is a movement wherein said disk surface of said magnet rotates around an axis, said axis defining a second direction, and
    wherein said first direction and said second direction are perpendicular, resulting in a spiraling relative movement.

2. The method according to claim 1, wherein said full scan comprises scanning a portion of said disk surface more than once, at subsequent rotation cycles of said relative rotational movement.

3. The method according to claim 1, wherein measuring said magnetic field by means of said magnetic camera device is performed at predetermined instances in time.

4. The method according to claim 3, wherein said predetermined instances in time are separated by constant time intervals.

5. The method according claim 1, wherein a speed of said relative translational movement and an angular speed of said relative rotational movement are predetermined.

6. The method according to claim 5, wherein a speed of said relative translational movement and an angular speed of said relative rotational movement are constant.

7. The method according to claim 1, wherein said spiraling relative movement results in a full scan of the magnetic field along said disk surface.

8. The method according to claim 1, further comprising the step of:

mapping associated positions or coordinates of said disk surface of said magnet to their respective magnetic field measurement.

9. An apparatus for determining a magnetic field of a magnet along a disk surface of said magnet, the apparatus comprising:
   a means for performing a relative movement between said disk surface of said magnet and a magnetic camera device; and
   a magnetic camera device comprising a one-dimensional array of at least two magnetic field sensors arranged along a first direction, to thereby obtain magnetic field measurements for said disk surface,
   wherein said means for performing a relative movement is adapted for performing a relative movement which is a continuous movement which is a combination of a relative translational movement parallel to said first direction and a relative rotational movement,
   wherein said relative translational movement is a movement along a radial direction of said disk surface of said magnet,
   wherein said relative rotational movement is a movement wherein said disk surface of said magnet rotates around an axis, said axis defining a second direction, and
   wherein said first direction and said second direction are perpendicular, resulting in a spiraling relative movement.

10. The apparatus according to claim 9, wherein said spiraling relative movement results in a full scan of the magnetic field along said disk surface.

11. The apparatus according to claim 10, wherein said full scan comprises scanning a portion of said disk surface more than once, at subsequent rotation cycles of said relative rotational movement.

12. The apparatus according to claim 9, wherein measuring said magnetic field by means of said magnetic camera device is performed at predetermined instances in time.

13. The apparatus according to claim 12, wherein said predetermined instances in time are separated by constant time intervals.

14. The apparatus according to claim 9, wherein a speed of said relative translational movement and an angular speed of said relative rotational movement are predetermined.

15. The apparatus according to claim 9, wherein a speed of said relative translational movement and an angular speed of said relative rotational movement are constant.

16. The apparatus according to claim 9 further comprising means for mapping associated positions or coordinates of said disk surface of said magnet to their respective magnetic field measurement.

* * * * *